United States Patent Office 3,728,154 Patented Apr. 17, 1973

3,728,154
SEMICONDUCTOR WAFER CLEANING
Clarence K. Suzuki, San Jose, Calif., assignor to Ronald R. Maagdenberg, Sunnyvale, Calif.
No Drawing. Filed Sept. 14, 1970, Ser. No. 72,126
Int. Cl. B08b 3/08
U.S. Cl. 134—3 13 Claims

ABSTRACT OF THE DISCLOSURE

A process for cleaning semiconductor surfaces using an aqueous wash solution of dilute sulfuric acid. The dilute acid is made with ultra clean deionized water. The semiconductor surfaces to be cleaned are dipped in and out of the solution immediately after the solution is formed.

BACKGROUND OF THE INVENTION

(I) Field of the invention

The present invention relates to methods for cleaning the surfaces of semiconductor wafers in order to eliminate surface contamination and to improve the quality and performance in the fabrication of semiconductor devices and circuits.

(II) Prior art

It has long been recognized that the cleanliness of a semiconductor surface is one of the most important factors in the fabrication of high quality and high yield semiconductor devices. The surface condition to the semiconductor plays an essential part in the performance of the final device, irrespective of whether the device processing requires one step or multiple steps. The surface condition of the semiconductor is particularly important in devices utilizing MOS technology.

Quite often polished semiconductor wafers (e.g. silicon) used to fabricate semiconductor devices and circuits are contaminated by dust, dirt, anions, cations, bacteria, inert particles, etc., despite careful packaging techniques and elaborate cleaning and protection procedures. Conventional techniques for cleaning semiconductor wafers, generally involve the use of concentrated sulfuric acid at temperatures around 125° C. by itself or concentrated sulfuric acid in conjunction with chromic oxide. The cleaning action of concentrated sulfuric acid is believed due to its molecular activity as an oxidizing agent and is represented by the following equation:

$$H_2SO \rightleftharpoons H_2O + SO_3\uparrow$$

The reaction represented by the above equation occurs readily at about 100° C., and the oxidizing power of $SO_3$ is utilized to decompose or dissolve the surface contaminants. The solution of concentrated sulfuric acid and chromic oxide (also commonly called "cleaning solution") is believed to utilize the same basic principle of oxidation described for concentrated sulfuric acid but is capable of decomposing more contaminants at a higher oxidation potential.

If a contaminant or other unwanted material exists in its fully oxidized form, it is not possible to destroy this substance using the oxidation potential of $SO_3$ (e.g. concentrated $H_2SO_4$) or that of the cleaning solution. It has been found that the heating, to about 100° C., of the prior art solutions discussed above enhances or increases the rate of oxidation but actually accomplishes no further cleaning of contaminants which have been fully oxidized. The present invention solves many of the cleaning problems inherent in the prior art techniques (e.g. removing oxidized contaminants) and yields semiconductor surfaces having suprisingly cleaner surfaces.

SUMMARY OF THE INVENTION

The present invention involves a simple and low cost method for providing clean and uncontaminated semiconductor surfaces. The present invention eliminates many of the elaborate and tedious procedures now required for the final cleaning of semiconductor wafers.

The present invention utilizes a freshly prepared dilute aqueous wash solution of sulfuric acid in a proper mixture in order to effectively utilize the heat of dilution. Typically the pH of wash solution is less than about 1. The formation of the dilute aqueous solution formed is represented by the following equation:

$$H_2SO_4 \rightleftharpoons \text{dilute } H_2SO_4 + \text{heat of dilution}$$

The diluted sulfuric acid is completely different in its chemical properties from hot concentrated sulfuric acid. In a dilute aqueous acid solution, the reactions are believed to be ionic, while in the concentrated acid, the reactions are molecular as discussed previously. Upon dilution with water, the sulfuric acid ionizes and this ionization increases with dilution. The ionic reaction which is believed to take place is shown in the following equations:

$$\text{(a)} \quad H_2SO_4 + H_2O \rightleftharpoons H^+ + HSO_4^- + H_2O$$

$$\text{(b)} \quad HSO_4^- \rightleftharpoons H^+ + SO_4^=$$

It is believed that the mechanism for the increased activity of a freshly prepared dilute acid is the abundance of $H^+$ and $SO_4^=$ ions produced which induces a polarization effect on the contaminants held on the semiconductor surface by strong valence bonds. It is further believed that heat generated, by virtue of the dilution, accelerates the velocity of the tiny $H^+$ ions which can then migrate or sneak under the contaminants, due to their small size, and exchange themselves with the contaminants and thus attach themselves firmly to the negatively ionized portions of the semiconductor surface. If the site where the migration occurs is negatively charged it becomes neutralized which frees the positively charged contaminant.

A positively charged site that holds a negatively charged contaminant is forced to free the contaminant if the $SO_4^=$ produces polarization due to its large inductive effect. The presence of many $H^+$ colliding against this surface is also believed to help dislodge the unwanted contaminants.

One of the important aspects of the invented process is the use of ultra-clean deionized water having a very low sub-micron particle count in forming the dilute aqueous acid solution. Some techniques for obtaining ultra-clean water and its importance will be described in more detail in the description of the preferred method.

Another important aspect of the invented cleaning process involves dipping the semiconductor wafers in and out of the hot dilute sulfuric acid solution during the treatment period. The dipping step eliminates gas bubbles that may adhere on the semiconductor surface. The bubbles often mask or protect the surface area under the bubble and prevent the desired ionic activity.

It had been found that the invented process works best when the dilute sulfuric acid aqueous solution is freshly prepared. A reheated dilute acid solution has been found to be less effective in causing the polarization and induction effects required to remove the surface contaminants. The reason for this is believed to be due to the absorption or adsorption of gases from the ambient during the cool-down period which do not boil off upon reheating and which may form complexes with the $H^+$ and $SO_4^=$ ions produced which induce a polarization effect on the contaminants held on the semiconductor surface (e.g., silicon) by strong valance bonds. The heat generated by the dilution is believed to accelerate the velocity of the tiny $H^+$ ions which then migrate under the contaminants because of their small size and exchange themselves with the contaminants on the negatively charged surface sites. The $SO_4^=$ ions induced polarization on positively charged sites because of their large inductive effect.

The description and explanation which follows will deal with silicon wafers. However, it should be clearly understood that the invention is not limited to silicon semiconductors. Any of the known semiconductor materials (e.g. germanium, etc.) having similar surface properties to silicon can also be cleaned by the invented process.

DESCRIPTION OF PREFERRED EMBODIMENTS

The proper proportions by volume of sulfuric acid to water in the wash solution can vary from 1 part concentrated acid to 9 parts water to 9 parts concentrated acid and 1 part water (ratio 1:9 to 9:1). However, a preferred wash solution giving particularly excellent results has been obtained using 3 parts acid to 2 parts water (ratio 3:2). For example, a wash solution consisting of 400 cc. water and 600 cc. acid for a total volume of 1,000 cc. has been found to be a convenient and effective solution for cleaning 10 to 20 one and one-half inch to two-inch silicon wafers in a pyrex or quartz beaker. The heat of dilution in this instance generates a temperature of about 150° C. Other compositions of acid and water may generate more or less heat upon dilution. For the case of the solution made from 3 parts acid to 2 parts water, the original temperature of 150° C. decays to about 130° C. in a period of five minutes in room ambient. The wash solution can be used after five minutes but it has been found that the activity decreases appreciably once the temperature falls below about 130° C.

It has been found that it is extremely important to obtain the best results to use an ultra-clean source of deionized water having a resistivity of about 16 to 18 megohms with a very low sub-micron particle count (less than about 0.1 micron). Neutral sub-micron particles do not get absorbed in deionization resin beds and pass through the best available filters. For example, "hechi-hechi" type surface water obtained from the Hechi-Hechi Reservoir in northern California is loaded with approximately 0.1–0.2 micron colloidal and neutral particles of pine, pollen, etc. The use of reverse osmosis deionized water is thus imperative in order to remove this source of tiny particles. Reverse osmosis is mainly used for removing organic matter. The reverse osmosis process of deionized water utilizes a molecular semipermeable membrane which effectively blocks particles from entering into the makeup of the deionized water. Satisfactory results have been obtained when the deionized water is free of particulate matter greater than 1 micron, and, excellent results have been obtained when the deionized water is free of particulate matter greater than 0.1 micron.

The presence of hechi-hechi water or other waters having similar characteristics may be detected by spotting a clean silicon wafer with the high resistivity deionized water and allowing the water to dry. A quick light inspection will reveal a "haze" to indicate the presence of tiny particles. The mechanism of this reaction is that the $CO_2$ in the air acidifies the 16–18 megohms deionized water, while the water dries out on the wafer. The pH comes to around 5.6 due to the formation of carbonic acid which precipitates the submicron colloidal neutral particles out of the deionized water. No particles will result as indicated by the "haze test" if hechi-hechi surface water is absent. The condition described is apparently associated with the use of aluminum hydroxide flocculator systems but the reverse osmosis system generally will eliminate the described undesirable condition. It has been found that double distilled deionized water obtained from an all quartz distiller will also provide satisfactory results.

It has been determined that for best results in practicing the invented method a concentrated reagent grade sulfuric acid with a specific gravity of 1.84 should be used. The following example sets forth a preferred solution and process conditions utilizing the invented process.

Example 400 cc. of ultra-clean deionized water was measured and placed into a large wall Pyrex beaker. 600 cc. of concentrated reagent grade sulfuric acid was placed in a cylinder or beaker then quickly poured into the beaker with the deionized water. Then silicon wafers which had been loaded into an appropriate wafer carrier, e.g., a quartz boat, were quickly immersed into the freshly prepared aqueous dilute sulfuric acid solution. The wafers were dipped in and out of this wash solution 5 times during a 5 minute treatment interval. At the end of the 5 minute treatment interval, the wafers were removed and rinsed for 5 minutes in a rinse solution of deionized water. The wafers were then removed from the rinse solution of deionized water and blown dry with a clean source of nitrogen gas or other inert gas.

The wafers cleaned by the process described in this example yielded surfaces with less contamination than silicon wafers cleaned by any of the known prior art techniques. Standard tests were used to evaluate the degree of contamination, such as, collimated light to locate tiny particle reflections, polarized light and interferometry to locate larger defects and particles and capacitance-voltage drift tests to determine the extent of surface contamination.

One of the important features of the invented cleaning process is that the wafers in the carrier boat must be dipped in and out of the hot dilute acid solution a number of times during the set time period. It has been found that an overall time period of about 5 minutes is sufficient. Obviously, the period may be decreased or extended in accordance with the cleanliness required or the particular surface conditions of the wafers to be treated. The particular time period may be determined empirically. The frequency of dipping may also be varied as required. However, it has been found that during a 5 minute treatment period, the frequency of dipping should preferably be about 3–10 times.

Ideally, the treatment should take place in the dilute sulfuric acid aqueous solution immediately after it has been freshly prepared and the temperature of the solution, because of the heat of dilution, is approximately 150° C. The instantaneous temperature is much greater than about 175° C. (can't be accurately measured) as soon as the concentrated acid is added to the water but averaged over the first 10 seconds, or so, the initial temperature is about 150° C. When freshly prepared dilute sulfuric acid aqueous solutions are used, the clean wafers appear almost perfectly clean as indicated by the strong collimated light test which show no haze or particle reflections. It has been found that the same solution when allowed to cool to room temperature in a clean laminar flow station and used to clean the same number of silicon wafers is highly ineffective in removing contaminants from the surface. Also, the same solution cooled to room temperature and then reheated to 150° C. is much less effective. It is theorized that the reheated acid solution is less effective because of the adsorption or absorption of gases from the ambient during the cool-down period which do not boil off on reheating and which form complexes with the $H^+$ and $SO_4^=$ ions. One of the examples of this theory is as follows:

$$CO_2+H_2O \rightleftharpoons H_2CO_3 \rightleftharpoons H^+ + HCO_3^-$$

$$HCO_3^- \rightleftharpoons H^+ CO_3^=$$

The extent of $HCO_3^-$ and $CO_3^=$ formation is $\ll 1\%$, but is believed to be quite significant in determining the effectiveness of the cleaning solution. The bicarbonate ($HCO_3^-$) and carbonate ($CO_3^=$) ions interfere with the desired ionic activity and cannot be boiled away as $CO_2$ until about 175° C. or higher and until about 10 minutes or more has lapsed. The experimental evidence outlined indicates that a freshly prepared solution gives better results than one that has been reheated as described above.

The freshly prepared solution is believed to be as effective and probably more effective in cleaning a polished silicon wafer surface than a hot hydrochloric acid etch at 1,200° C. This latter observation was made by observing the manner in which glass films were grown on cleaned wafer surfaces immediately following the cleaning by both the invented solution and one using hot HCl.

The surprising and unexpected results of this invention rest with the simplicity and the results that are achieved with very little processing, thus reducing the overall processing costs tremendously. No elaborate and tedious procedures are required for a final cleaning.

The present process can be combined with other cleaning techniques. For example, an oxidation cleaning using nitric acid or concentrated sulfuric acid for a cleaning solution can be followed by a final cleaning using the freshly prepared dilute acid solution with the proper frequency of dipping, as described above. Similarly, hydrofluoric acid etched wafers can be cleaned in the final step to remove fluoride ions attached to the wafers in order to reduce the surface charge ($Q_{ss}$) caused by surface states on the oxide of the subsequent gate oxide in MOS processing.

Also, dirty wafers due to standard packaging techniques can be cleaned by the invented process to a state equivalent to that obtained using different multiple prior art steps (up to about 20) including a hot chromic acid clean, $HNO_3$, all various solvent cleanings, (e.g., tetrachloroethylene, acetone, alcohol, etc.) and including the various forms of boil and vapor degreasing techniques, as well as, ultrasonic and spraying techniques. Obviously, a one step cleaning procedure results in economy just from the time saved when compared to the various standard procedures indicated above.

It should be understood that while the above preferred description deals with certain concentrations of dilute aqueous solutions of sulfuric acid, certain time periods for treatment, certain frequencies for dipping the wafers during treatment and certain time periods for rinsing, the invention is not so limited. Various changes may be made taking into account the degree of surface contamination, the size and quantity of the semiconductor wafers to be cleaned and the degree of cleanliness required.

I claim:

1. A process for cleaning semiconductor wafers prior to fabrication for semiconductor circuit or device on said wafer, said process comprising the steps of:

preparing a fresh wash solution by mixing a quantity of concentrated sulfuric acid with a quantity of deionized water within a vat, the part ratio of the quantity of concentrated sulfuric acid to deionized water being in the range of approximately 1:9 to 9:1;

immersing a semiconductor wafer prior to fabrication of a semiconductor circuit or device on said wafer into said freshly prepared wash solution for treatment and repeatedly dipping said wafer in and out of said wash solution a plurality of times during a treatment interval and removing said wafer from said wash solution, said wafer being first immersed in said wash solution within ten seconds after the wash solution is prepared;

rinsing said wafer in a rinsing solution; and then removing said wafer from said rinse solution and drying said wafer.

2. The process of claim 1 in which the treatment interval is approximately five minutes and said wafer is repeatedly dipped in and out of the wash solution approximately 3 to 10 times during said interval.

3. The process of claim 1 including the further step of removing particulate matter from said water by reverse osmosis prior to mixing said water with said concentrated sulfuric acid.

4. The process of claim 3 in which the concentrated sulfuric acid has a specific gravity of approximately 1.84, the deionized water has a resistivity of approximately 16 to 18 megohms and the water is substantially free of particulate matter greater than 1 micron.

5. The process of claim 1 in which the concentrated sulfuric acid has a specific gravity of approximately 1.84.

6. The process of claim 5 in which said deionized water has a resistivity of approximately 16 to 18 megohms.

7. The process of claim 6 in which said deionized water is substantially free of particulate organic matter greater than 1 micron.

8. The process of claim 7 in which the part ratio of the quantity of concentrated sulfuric acid to deionized water is approximately 3:2.

9. A process of cleaning semiconductor wafers comprising the steps of:

preparing a wash solution in a vat, the wash solution including a quantity of concentrated sulfuric acid and a quantity of ultra-clean deionized water in which the heat of dilution causes said wash solution to have a temperature within the range of approximately 130° C. to 150° C.;

immersing a semiconductor wafer into said freshly prepared wash solution for treatment and then repeatedly dipping said wafer in and out of said wash solution a plurality of times during a treatment interval, said wafer being immersed in said wash solution within ten seconds after the wash solution is prepared; and removing the wafer from the wash solution and rinsing the wafer in a deionized water solution.

10. The process of claim 9 in which the part ratio of the quantity of concentrated sulfuric acid to deionized water of the wash solution is in the range of approximately 3:2.

11. The process of claim 9 in which the part ratio of the quantity of concentrated sulfuric acid to deionized water of the wash solution is in the range of 1:9 to 9:1.

12. The process of claim 11 in which the concentrated acid has a specific gravity of approximately 1.84 and said deionized water of the wash solution is substantially free of organic matter and has a resistivity of about 16–18 megohms.

13. The process of claim 11 in which the treatment interval is approximately five minutes and the wafers are repeatedly dipped in and out of the wash solution approximately 3 to 10 times during said interval.

References Cited

UNITED STATES PATENTS

| | | | |
|---|---|---|---|
| 2,916,407 | 12/1959 | Buck et al. | 134—30 |
| 2,973,289 | 2/1961 | Cropp et al. | 134—28 X |
| 3,082,136 | 3/1963 | Finn | 252—79.2 X |
| 2,320,080 | 5/1943 | Hight | 134—3 X |

FOREIGN PATENTS

| | | | |
|---|---|---|---|
| 1,209,844 | 1/1966 | Germany | 252—79.2 |

MORRIS O. WOLK, Primary Examiner

D. G. MILLMAN, Assistant Examiner

U.S. Cl. X.R.

134—32; 156—17